United States Patent [19]
Schelten et al.

[11] Patent Number: 5,880,471
[45] Date of Patent: *Mar. 9, 1999

[54] NEUTRON DETECTOR

[75] Inventors: Jakob Schelten, Jülich; Richard Reinartz, Langerwehe, both of Germany

[73] Assignee: Forschungszentrum Jülich, Jülich, Germany

[ * ] Notice: This patent issued on a continued prosecution application filed under 37 CFR 1.53(d), and is subject to the twenty year patent term provisions of 35 U.S.C. 154(a)(2).

[21] Appl. No.: 688,247

[22] Filed: Jul. 29, 1996

[30] Foreign Application Priority Data

Sep. 1, 1995 [DE] Germany ............ 195 32 415.3

[51] Int. Cl.$^6$ .................. G01T 3/06; G01T 3/08
[52] U.S. Cl. .................. 250/370.05; 250/390.11
[58] Field of Search .......... 250/390.01, 370.05, 250/390.02, 390.11

[56] References Cited

U.S. PATENT DOCUMENTS

| | | | |
|---|---|---|---|
| 3,227,876 | 1/1966 | Ross | 250/370.05 |
| 4,365,159 | 12/1982 | Young | 250/390.01 |
| 4,419,578 | 12/1983 | Kress | 250/370.05 X |
| 4,814,623 | 3/1989 | Robertson et al. | 250/390.11 |
| 5,019,886 | 5/1991 | Sato et al. | 357/29 |
| 5,281,822 | 1/1994 | Albrecht et al. | 250/370.05 |
| 5,321,269 | 6/1994 | Kitaguchi et al. | 250/370.05 |
| 5,399,863 | 3/1995 | Carron et al. | 250/370.05 |
| 5,726,453 | 3/1998 | Lott et al. | 250/370.05 |

FOREIGN PATENT DOCUMENTS

| | | | |
|---|---|---|---|
| 55-95886 | 7/1980 | Japan | 250/370.05 |
| 1253683 | 10/1989 | Japan . | |
| 2-27776 | 1/1990 | Japan | 250/370.05 |
| 8-180370 | 6/1994 | Japan | 250/370.05 |

OTHER PUBLICATIONS

D. Sueva et al., "Silicon Detectors for Charged Particles Manufactured by Conventional Planar Technology",*Transactions on Nuclear SCI*, vol. 40, No. 3, Jun. 1993.

T.R. Herold, "Neutron Spectrum of $^{238}$PuF$_4$", Nuclear Instruments and Methods, 71, 1969.

*Primary Examiner*—Edward J. Glick
*Attorney, Agent, or Firm*—Klaus J. Bach

[57] ABSTRACT

In a neutron detector for the detection of thermal neutrons $_6$LiF layers are provided for the conversion of the neutrons to ionizing radiation and the $_6$LiF layers are surrounded by layers for detecting the ionizing radiation generated by the neutrons in the $^6$LiF layers.

4 Claims, 5 Drawing Sheets

Detail 1

6-6

Detail 2

NEUTRON DETECTOR

BACKGROUND OF THE INVENTION

The invention relates to a neutron detector.

Spatial resolution detectors are known which have multi-wire chambers filled with helium gas or which utilize scintillation detectors operating according to the Anger camera principle. In both cases, an adequate spatial resolution, a reasonable detection probability and an acceptable gamma radiation discrimination are obtained. Sensitive detector surfaces of 50cm×50cm can be provided although at considerable expense.

It is the object of the present invention to provide a neutron detector which utilizes a different principle.

SUMMARY OF THE INVENTION

In a neutron detector for the detection of thermal neutrons $^6$LiF layers are provided for the conversion of the neutrons to ionizing radiation and the $^6$LiF layers are at least partially surrounded by means for detecting the ionizing radiation.

Since neutron radiation has no ionizing effects, it cannot be directly detected, for example by a semiconductor diode. Neutron radiation can only be detected in an indirect way after conversion to ionizing radiation by a resulting ion-, electron- or gamma radiation. However, a converter for converting reaction radiation to detectable radiation does not only need to convert the neutron radiation with the highest possible probability, but the converted neutron radiation, that is the ionizing radiation generated in the converter must also have a sufficiently large travel range so as to be able to leave the converter structure. Only if these two conditions are met can the neutron radiation be detected by an associated semiconductor diode.

The two conditions are most easily met by a converter structure of $^6$LiF. During the neutron capture in $^6$LiF, energies of 4.6 MeV are generated which are divided between the two fission products $^3$H and $^4$He. This ionizing radiation has the required large range in $^6$LiF that is about 32 $\mu$m for $^3$H in LiF. The (n, $^6$Li) reaction in this example occurs without emission of gamma radiation.

The neutron detection occurs by the recording of the ionizing radiation exiting the $^6$LiF structure. Semiconductor diodes are especially suitable for such recordings.

Semiconductor diodes which are arranged in a blocking position are fast and inexpensive detectors for ionizing radiation as long as a major part of the ionizing of the radiation to be detected occurs in the barrier zone of the diode. This condition is met for high energy light and heavy ions in the energy range of 0.1–100 MeV as well as for electrons or positrons in the energy range of 10–100 keV.

Assuming that the thickness of a semiconductor detector is given in the Z direction of a Cartesian coordinate system, semiconductor detectors having electrodes consisting of strips extending in the x and y directions provide for neutron detectors of this type with particularly good spatial resolution since, on the average, only ~3eV are consumed for the generation of a charge carrier pair. For comparison, the energy consumption in a gas-filled proportional counter is about 30eV whereas a scintillator consumes about 300eV for the generation of a light quantum. It is pointed out in this connection that only about every fifth light quantum generates a photoelectron on the photocathode of a multiplier.

Preferably, the $^6$LiF converter consists of several thin layers which are sandwiched between two means for detecting the ionizing radiation, particularly between depletion layers of semiconductor detectors. With such an arrangement, a sufficiently high detection probability for neutron radiation is achieved.

In order to achieve better absorption probabilities, the radiation penetration depth for neutrons in the converter should be 100 $\mu$m or more. On the other hand, with layer thicknesses of planar converters which are greater than half the $^3$H travel distance, the probability that at least the energy of 1 MeV is deposited in the barrier layer of the semiconductor becomes smaller and smaller. This difficulty can be overcome only by arranging the converter and semiconductor in a side-by-side relationship rather than in a series relationship. This is why an arrangement wherein the converter structure is arranged within the means for recording the ionizing radiation is particularly advantageous. The converter structure may be provided, for example, in the form of strips disposed in narrow and deep grooves in the silicon semiconductor.

Particularly suitable for this purpose are $^6$LiF layers or $^6$LiF strips which are arranged normal to the barrier layer of a semiconductor diode.

The layer or strip thickness is preferably smaller than the maximum travel distance of the converted neutron radiation in $^6$LiF. The $^3$H particle has a greater travel range than the $^4$He particle. In this way, it can be made sure that, with a suitable positioning of the device relative to the neutron radiation, a sufficiently high absorption probability for the neutrons in the converter is achieved and that the converted neutron radiation reaches the detector structure and can be detected therein. For the same reason, the strip width should also be smaller than the maximum travel distance of the converted neutron radiation if strips are used for recording the converted neutron radiation.

The arrangement is appropriate if the neutron radiation has a direction normal to the layer or strip thickness and strip width.

It is advantageous to provide at least two diodes with $^6$LiF strips disposed therein wherein the diodes are so arranged that the $^6$LiF strips in one of the diodes are displaced with respect to those in the other diode. With such an arrangement, a complete surface coverage with $^6$LiF is achieved provided that the detector is suitably positioned with respect to the radiation direction.

At the present time, a sensitivity to thermal and subthermal neutrons of up to 50% is achieved. Both detectors can be used as zero, one, or two dimensional spatial resolution detectors or as neutron monitors.

DESCRIPTION OF PREFERRED EMBODIMENTS

Table 1 contains the most important properties of a converter consisting of enriched lithium fluoride and the semiconductor silicon as far as those properties are important for the present consideration.

Listed are the neutron absorption cross-sections and the absorption coefficients for the two wave lengths 0.6 nm and 1.8 nm, which represent subthermal and thermal neutrons. Herefrom, the layer thicknesses are determined which are required to achieve an absorption probability of 63%. During the neutron capture by $^6$Li, the fission products $^3$H and $^4$He with the kinetic energies of 2.63 MeV and 1.97 MeV are generated. With a simulation program, the travel distances in LiF and in Si were determined for those initial energies and other initial energies. The travel distances for the lighter and more energetic reaction partner $^3$H on neutron capture are noticeably greater than those of the heavier and less energetic partner $^4$He. The $^3$H travel distances are 32 nm and 37 nm in LiF and Si respectively and the $^4$He travel distances are only 6.0 nm and 6.9 nm. In order to generate a sufficient number of charge carriers, at least half of the travel trace of a $^3$H should be within the silicon. With a $^6$LiF layer which has a thickness of 16 $\mu$m and which is limited at opposite sides by a Si diode, this will be true for 50% of all the traces. Generally, the relative part of the traces considered on this basis to be usable is determined by the probability Ws defined, in planar geometry by the equation, $$Ws=1-d/R, \text{ if } d \leq R/2 \qquad (1)$$

wherein d is the thickness of a single layer and R the travel distance of the $^3$H in the converter. For d=R/2= 16 $\mu$m, the absorption probability Wa is, according to table 1, for subthermal neutrons already 32% and the detection probability of traces according to equation (1) is Ws=0.5.

Consequently, the detection probability for a neutron is:

$$Wn=Wa \times Ws=16\%.$$

In order to achieve the required absorption probability, three such layers together with diodes at opposite sides of each layer are needed. If the layer thicknesses used for the converter are smaller, the probability Ws for the detection of traces increases but more layers are needed to maintain the same absorption probability Wa.

Figure 1:
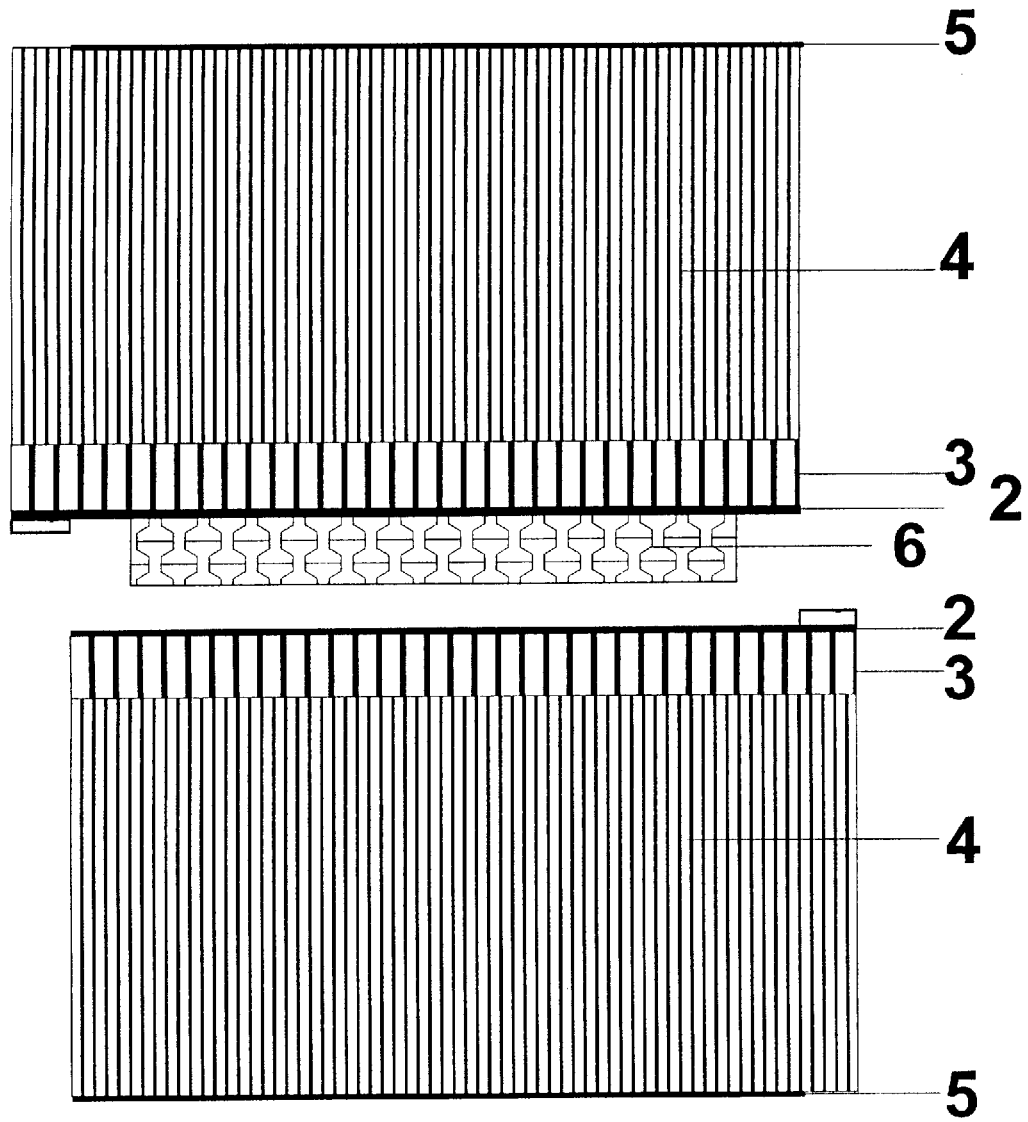
FIG. 1 is a cross-sectional view of a double diode detector with a planar converter (type A)
Figures 2, 3:
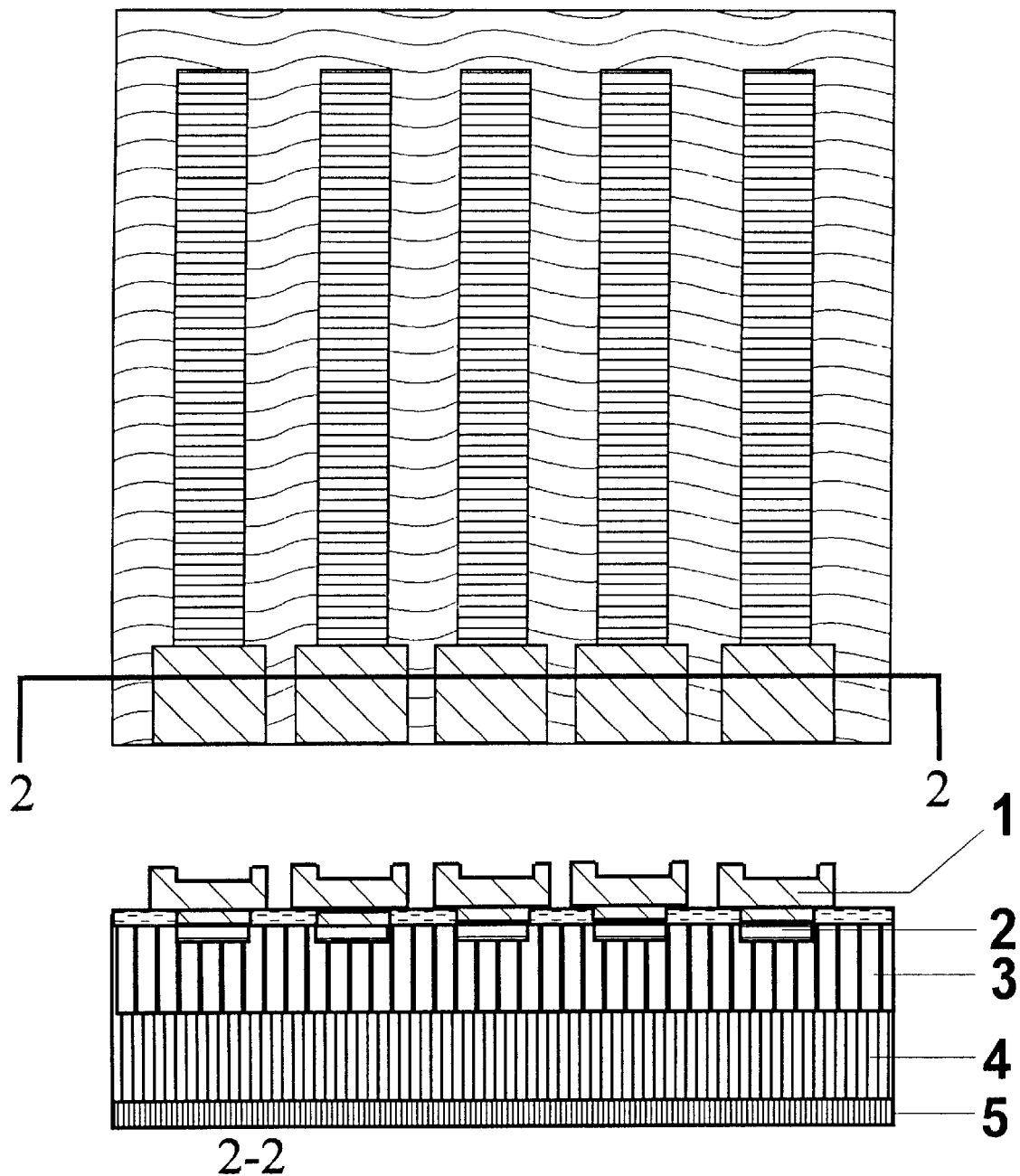
FIG. 2 is a partial detail view of the double diode detector shown in FIG. 1.
FIG. 3 is a cross-sectional view taken along line 2—2 of FIG. 2.

Such a detector is shown in FIG. 1 in a cross-sectional representation. Shown are two diodes 4 each comprising n-doped silicon with n$^+$ layers 5 at opposite ends and depletion layers 3 with p$^+$ face layers 2 at adjacent ends. The converter layer 6 with a thickness of 16 $\mu$m is disposed on one of the two diodes 4. The diodes are mounted at a distance in order to prevent damage to the converter layer 6. The metal pads for the p$^+$ layer strips 2 are disposed on opposite sides and are freely accessible for wiring. FIGS. 2 and 3 show the diode structure with the p$^+$ and the metal pads 1 on one side in greater detail. The n$^+$ layer 5 on the opposite side also consists of strips which start out from underneath other pads. These strips 5 extend in a direction normal to that in which the p$^+$ layer strips 2 extend.

For the accurate positioning of the opposite wafers, the wafers are provided with marks such as bores.

With the reverse bias voltage applied, the depletion layer should have a thickness of about 15 $\mu$m. This is easily achievable with the usual doping of 10$^{15}$ cm$^{-3}$.

Table 2 lists the most important properties of a detector which comprises two diodes with an intermediate converter layer. Its low detection probability for even subthermal neutrons is quite unsatisfactory. All other properties are very good. For such an arrangement the detection probability can be improved only by hybridization. With three or, respectively, six such units, a detection probability for subthermal neutrons of almost 50% is achievable.

In order to achieve a greater absorption probability, the travel distance for the neutrons in the converter must be 100 $\mu$m or more. On the other hand, with layer thicknesses of the planar converters which are greater than half the $^3$H travel distance, the probability that at least the energy of 1 MeV is deposited in the barrier layer of the semiconductor becomes smaller and smaller. The only possibility to overcome this difficulty is to arrange the converter and semiconductor in a parallel arrangement rather than in a series arrangement.

Taking into consideration the micro-electronic and micro-mechanical properties of the silicon the (110) oriented n-doped silicone wafer is provided by etching deep grooves extending in the (1—1 2) direction. The unisotropic etching with EDP (a solution comprising ethyldiamin, brenzkatechin, and water) occurs with a high etching rate in the {110} direction that is, in this case, into the depth and with only ¹⁄₁₀₀ of that rate in the {111} direction, which means a certain under-etching during etching of the deep grooves. The two vertical side walls of the grooves in the (1—1 2) direction in a wafer wherein a line normal to the plane of the wafer is in a crystallographic (110) direction, are the (1—1—1) crystal surfaces.

The groove width should be 16 $\mu$m, that is about half the travel distance of the $^3$H fission partners. The width of the webs which limit the grooves are selected so as to have also a width of 16 $\mu$m.

Figure 4:
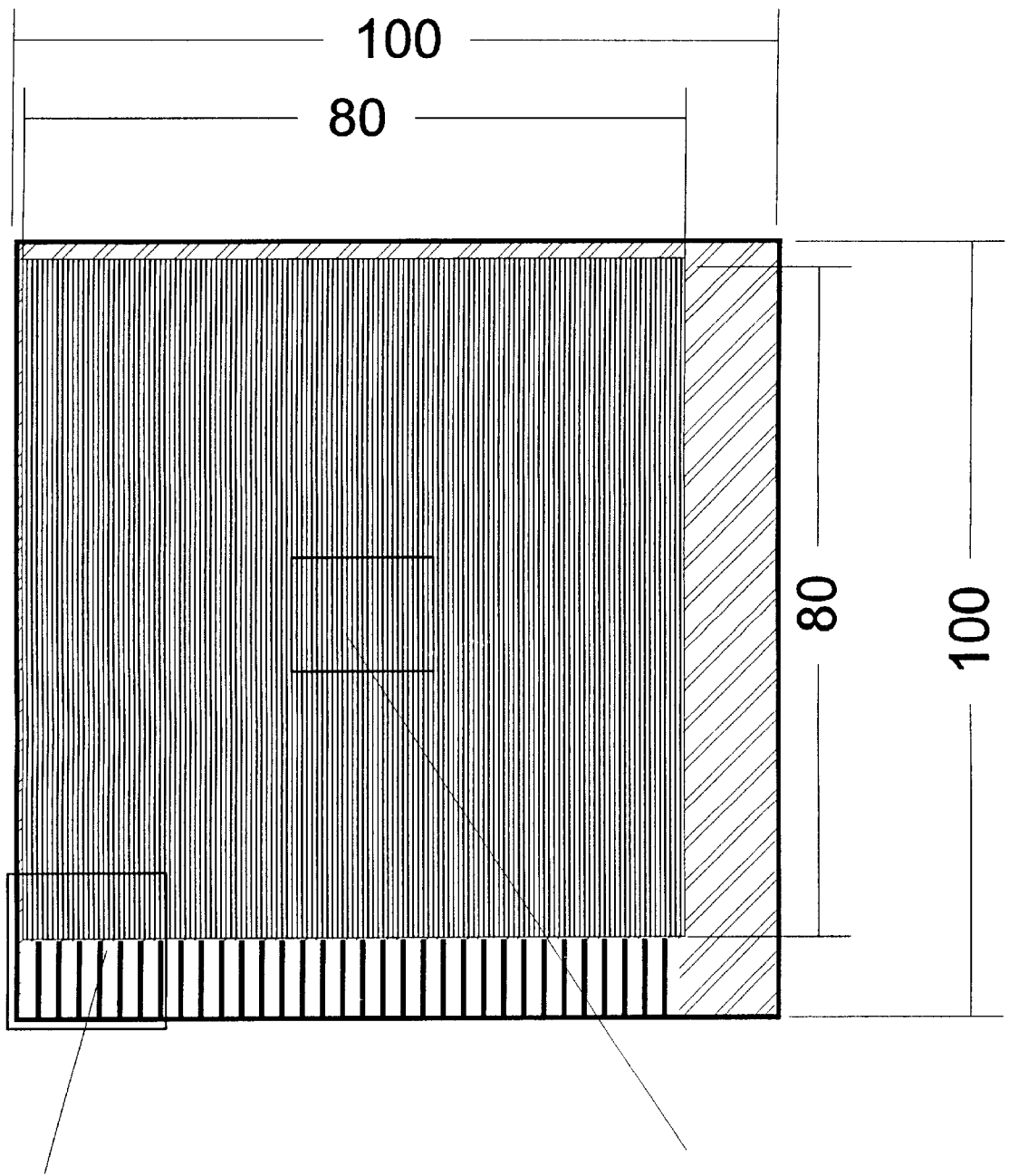
FIG. 4 shows a detector with a strip-like converter arrangement (type B)
Figure 5:
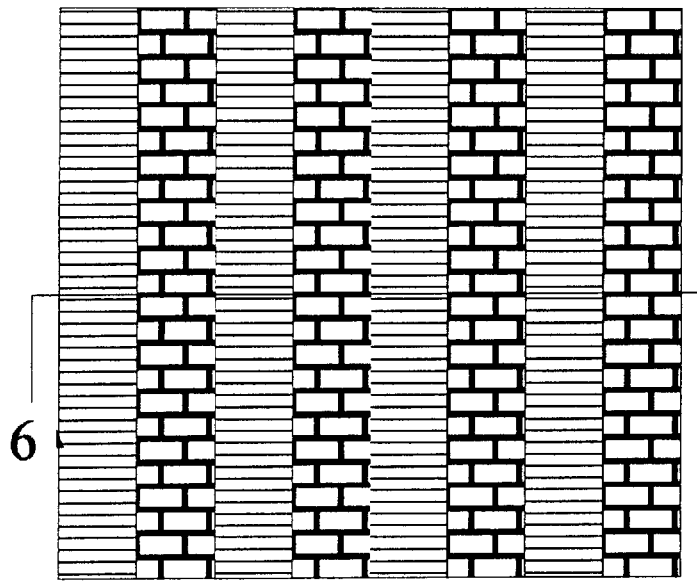
FIG. 5 is an enlarged view of a portion of FIG. 4 as enclosed by a frame marked "Detail 1"
Figure 6:
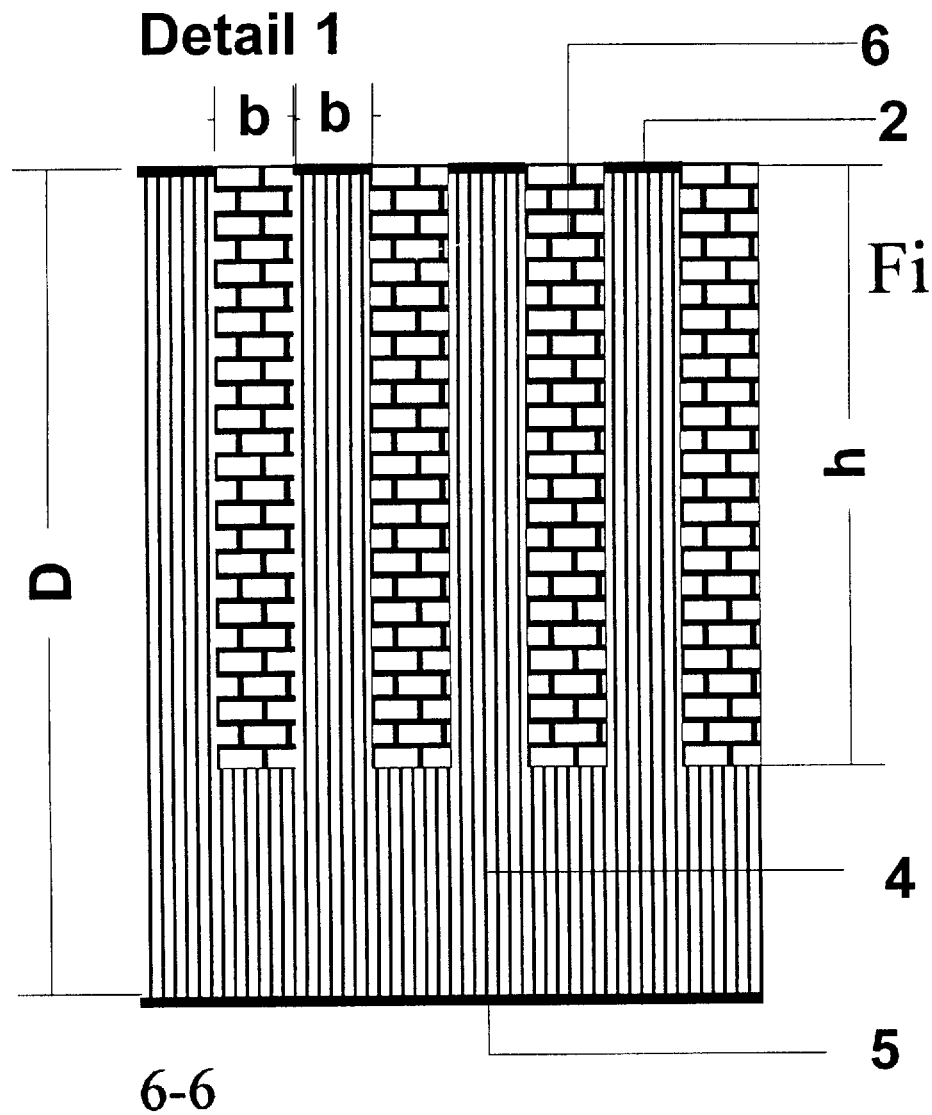
FIG. 6 is a cross-sectional view of FIG. 5 taken along line 6—6 of FIG. 5.
Figure 7:
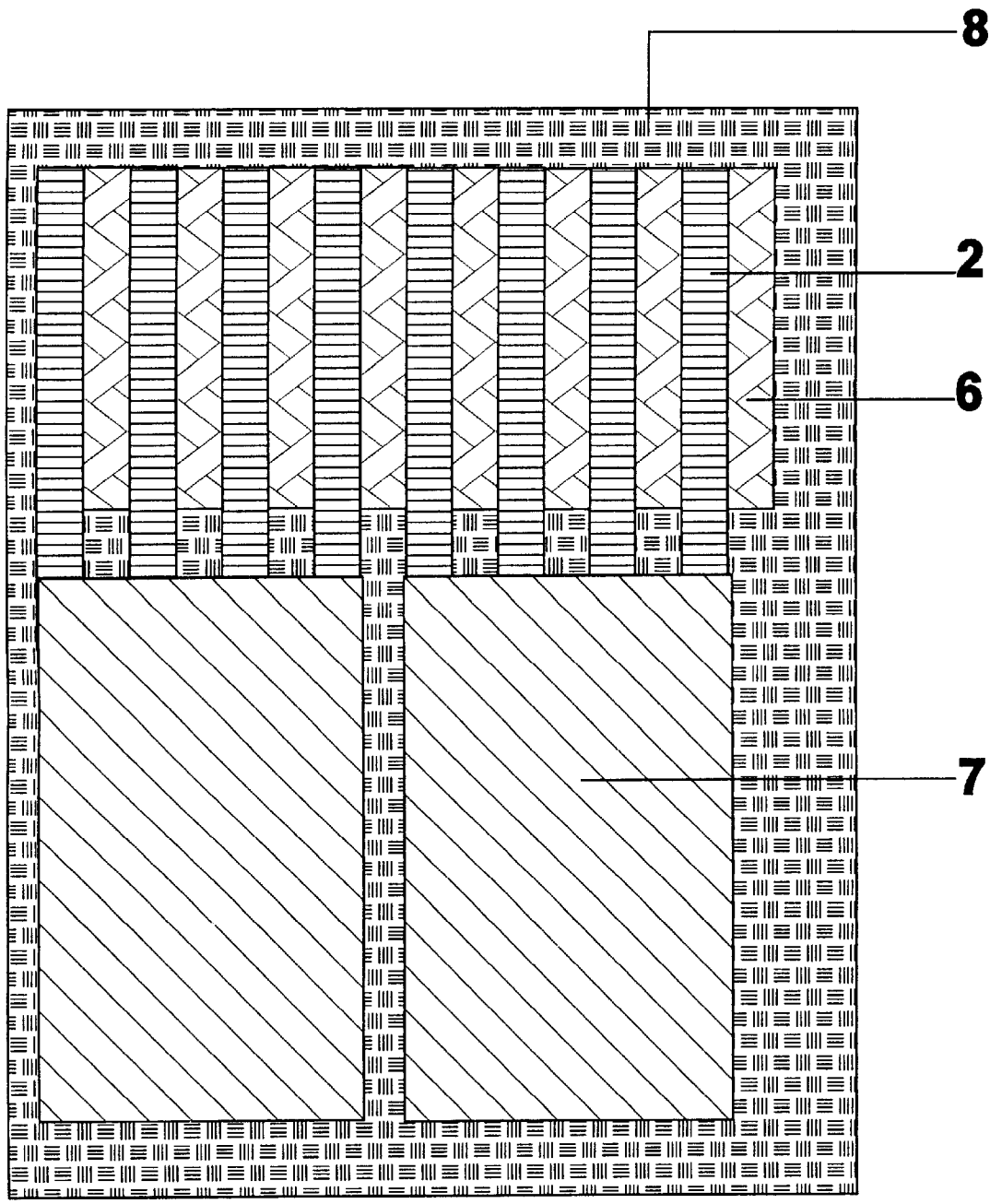
FIG. 7 is an enlarged concentrated view showing only two metal pads of FIG. 4 with a few conversion and detection layers disposed within an insulating structure.

FIG. 4 is a top view of the detector and FIGS. 5, 6 and 7 show details of FIG. 4 in an enlarged fashion to show the arrangement of the vonverter layer 6 in the n-doped, silicon 4 provided at one side with the n$^+$ layer 2. FIG. 7 further shows in detail the metal pad 7 from which the p$^+$ layers 2 extend with the LIF converter layers 6 sandwiched therebetween and provided with insulator structures 8.

Such wafers with grooves which are filled with LiF powder can absorb maximally 50% of all neutrons since, on the average, 50% of the neutrons are in the webs, not in the grooves filled with LiF. In order to achieve an absorption probability of more than 50%, the detector must comprise two such wafers which are displaced relative to one another by the width b of the web, so that a neutron passes either in the front part or in the rear part of the detector into a groove filled with LiF.

The doping of the semiconductor is so selected that, with the voltage applied in the reverse direction between the p$^+$ and the n$^+$ doping at both sides of the wafer, the depletion layer, which starts at the p$^+$ doping, has a depth which is at least the same as the depth of the groove filled with LiF.

The p$^+$ doping strips terminate in large area pads on one side of the detector. As shown in FIG. 4, four adjacent strips terminate in one pad that is the pads are disposed successively at a distance of 8×16=128 $\mu$m from one another. If it is desired to obtain resolutions of 1 mm, five such successive pads can be interconnected electrically. The bottom side also consists of strips which are n$^+$ doped and which extend normal to the p$^+$ strips. Again, they terminate in pads which are electrically interconnected in groups.

With a neutron capture in one of the LiF filled grooves, a $^3$H trace is generated which passes, with 50% probability, into one of the adjacent Si webs such that the ionization energy of 1MeV is deposited. About 300,000 charge pairs are generated which are carried away by the electrical field applied. Consequently, the spatial determination has an uncertainty of ±b.

Further properties of the detectors are summarized in table 3. Thermal and subthermal neutrons are detected with sufficient probability, the spatial resolution is good and discrimination with regard to gamma radiation is possible.

For a detector of the type A, all manufacturing steps for making the diode with the doping strips and the metal pads are available in the microelectronic art. Novel is only the coating of the converter material with a 16 μm thick layer and the combination of the diodes to a double diode in accordance with FIG. 1.

For the LiF coating, a mixture of 100 cm$^3$ acetone, 2 cm$^3$ PMMA lacquer with a PMMA content of about 5% and 1 g $^6$LiF powder is used. $^6$LiF powder with an average particle size of 2 μm f is commercially available. For the PMMA lacquer, acetone is a good solvent, LiF is insoluble in acetone.

The desired LiF converter layer of a thickness d=16 μm corresponds to a surface coverage B=rd=4.2 mg×cm$^{-2}$. This coverage is obtained by drying the mixture with which the LiF is deposited. The LiF is contained in the mixture described with a proportion of about 10 mg cm$^{-3}$. The sedimentation mixture had originally a height of 4.2 mm. The PMMA which also remains increases the adhesion among the LiF particles and to the substrate. It comprises about 10 wt % of the filler mass.

A detector of the type B is manufactured as follows:

1. A suitably doped wafer with an orientation (110) is first oxidized. Then the oxide is exposed in strips with a width of 16 μm. The grooves are formed by etching in EDP, the depth of the grooves being determined by the etching time.
2. The etched wafer is again oxidized in order to inactivate the surfaces exposed by the etching. Then the strips are exposed lithographically for the subsequent p$^+$ doping on the upper side and the n$^+$ doping on the bottom side.
3. In a lift-off procedure, gold pads are placed over the ends of the p$^+$ and n$^+$ strips.
4. In order to fill the grooves with LiF, 10 g LiF powder and 2 cm$^3$ PMMA lacquer are mixed with acetone so as to form a paste by which the grooves in the Si wafer are filled. Projecting remainders are washed away with acetone. A final filling step may be needled.
5. The two wafers are positioned relative to one another by way of adjustment marks and holes etched into the wafers and are then cemented together.

TABLE 1

SPECIFICATIONS FOR THE $^6$LiF CONVERTER
AND FOR THE SEMICONDUCTOR SILICON

| PHYSICAL ENTITY VALUE | $^6$LiF | Si |
|---|---|---|
| DENSITY [g cm$^{-3}$] | 2.52 | 2.33 |
| ATOMIC NUMBER DENSITY [cm$^{-3}$] | 6.3 × 10$^{22}$ | 5.0 × 10$^{22}$ |
| S$_{abs}$ with λ = 0.6 nm | 3166 | 0.33 |
| S$_{abs}$ with λ = 0.18 nm | 950 | 0.10 |
| S$_{abs}$ with λ = 0.6 nm [cm−1] | 200 | 0.017 |
| S$_{abs}$ with λ = 0.18 nm [cm−1] | 60 | 0.005 |
| Wa for 16 μm $^6$LiF and | | |
| with λ = 0.6 nm | 0.320 | — |
| with λ = 0.18 nm | 0.096 | — |
| Wa$^{total}$ = 63% for D$_{total}$ = 1/S$_{abs}$ | | |
| D$_{total}$ with λ = 0.6 nm | 50 μm | 58 cm |
| D$_{total}$ with with λ = 0.18 nm | 167 μm | 200 cm |
| N-ABSORPTION | | |
| Fission Products | $^3$H$_1$ + $^4$He$_2$ | — |
| Energy Values [MeV] | 2.63 + 1.97 | — |
| Total Energy [MeV] | 4.6 | — |
| TRAVEL DISTANCES | | |
| for 2.63 MeV $^3$H [μm] | 32.2 | 39.5 |
| for 1.97 MeV $^4$He [μm] | 6.05 | 6.9 |
| for 2.0 MeV $^3$H [μm] | 22 | 26.1 |
| for 1.0 MeV $^4$He [μm] | 3.28 | 3.4 |
| for 1.0 MeV $^3$H [μm] | 9.2 | 9.65 |
| for 0.5 MeV $^4$He [μm] | 1.96 | 2.02 |

TABLE 2

PROPERTIES OF DETECTOR TYPE A

| DETECTOR TYPE A<br>APPLICATION | TWO DIODES WITH A PLANAR<br>CONVERTER LAYER<br>SUBTHERMAL NEUTRONS<br>λ = 0.6 nm |
|---|---|
| ABSORPTIONS - PROBABILITY | 32% |
| DETECTION PROBABILITY OF $^3$H - TRACES Ws | 50% |
| DETECTION PROBABILITY Wn = WaxWs | 15% |
| IONIZATION ENERGY IN THE BARRIER LAYER | >1 MeV |
| GAMMA SENSITIVITY - VERY LOW | <<1 × 10$^{-6}$ |
| LOCAL RESOLUTION - EXTREMELY GOOD | <<1 mm |

TABLE 3

PROPERTIES OF DETECTOR TYPE B

| DETECTOR TYPE B | TWO WAFERS WITH 16 μm GROOVES FILLED WITH $^6$LiF THERMAL AND SUBTHERMAL NEUTRONS | |
| --- | --- | --- |
| APPLICATIONS | 1 = 0.6 nm | 1 = 0.6 nm |
| ABSORPTION PROBABILITY Wa | | |
| with a groove depth t = 50 μm | 63% | 26% |
| with a groove depth t = 100 μm | 86% | 45% |
| with a groove depth t = 200 μm | 98% | 70% |
| PROBABILITY FOR $^3$H TRACE IN Si WITH >1 MeV IONIZATION Ws | 50% | |
| DETECTION PROBABILITY OF NEUTRONS Wn = Ws Wa with | | |
| t = 50 μm | 30% | 13% |
| t = 100 μm | 40% | 22% |
| t = 200 μm | 50% | 70% |
| GAMMA SENSITIVITY - SMALL, PULSE FORM ANALYSIS POSSIBLE | $<1 \times 10^{-5}$ | |
| LOCAL RESOLUTION - GOOD MAXIMALLY 32 μm | <<1 mm | |

What is claimed is:

1. A neutron detector including $^6$LiF for the conversion of neutron radiation to ionizing radiation comprising at least one semiconductor diode structure including a depletion layer having a plurality of parallel spaced grooves extending normal to, and being formed into, said depletion layer, and including $^6$LiF layers disposed in said grooves in spaced side-by-side relationship with said depletion layer forming detection layers disposed between, and on opposite sides of, the $^6$LiF layers so as to provide for alternate $^6$LiF and detection layers for detecting said ionizing radiation emitted from said $^6$LiF layers.

2. A neutron detector according to claim 1, wherein said $^6$LiF layers have a thickness smaller than the travel distance in $^6$LIF of the $^3$H radiation generated during the conversion of the neutron radiation.

3. A neutron detector according to claim 1, wherein said at least one semiconductor diode structure comprises at least two semiconductor diode structures, said at least two semiconductor diode structures being so arranged that the $^6$Lif layers of one of the diode structures are displaced with respect to the $^6$Lif layers of an adjacent diode structure.

4. A neutron detector according to claim 1, wherein said detection layers are also arranged at least at one end of said $^6$LiF layers to increase the detection capability of said detector.

* * * * *